US009502596B2

(12) United States Patent
Pass et al.

(10) Patent No.: US 9,502,596 B2
(45) Date of Patent: Nov. 22, 2016

(54) PATTERNED THIN FOIL

(71) Applicant: SunPower Corporation, San Jose, CA (US)

(72) Inventors: Thomas Pass, San Jose, CA (US); Richard Sewell, Los Altos, CA (US); Taeseok Kim, Pleasanton, CA (US); Gabriel Harley, Mountain View, CA (US); David F. J. Kavulak, Fremont, CA (US); Xiuwen Tu, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 256 days.

(21) Appl. No.: 13/931,538

(22) Filed: Jun. 28, 2013

(65) Prior Publication Data

US 2015/0000724 A1 Jan. 1, 2015

(51) Int. Cl.
*H01L 31/0224* (2006.01)
*H01L 31/04* (2014.01)
*H01L 31/05* (2014.01)
*H01L 31/068* (2012.01)
*H01L 31/18* (2006.01)
*H01L 31/048* (2014.01)

(52) U.S. Cl.
CPC ......... *H01L 31/048* (2013.01); *H01L 31/0516* (2013.01); *H01L 31/1876* (2013.01); *Y02E 10/50* (2013.01); *Y02P 70/521* (2015.11)

(58) Field of Classification Search
CPC ............. H01L 31/0516; H01L 31/048; H01L 31/022425; H01L 31/022441; H01L 31/18; H01L 31/0504; H01L 31/1804; H01L 31/0682; H01L 31/1892; H01L 31/0392; H01L 31/1896; H01L 31/1876; Y02P 70/521; Y02E 10/50; Y02E 10/547; Y02E 10/544
See application file for complete search history.

(56) References Cited

U.S. PATENT DOCUMENTS

| 6,940,008 | B2 | 9/2005 | Shiotsuka et al. | |
| 2004/0255999 | A1* | 12/2004 | Matsushita et al. | 136/244 |
| 2008/0216887 | A1 | 9/2008 | Hacke et al. | |
| 2010/0229933 | A1* | 9/2010 | Cornfeld | 136/256 |
| 2012/0103408 | A1* | 5/2012 | Moslehi et al. | 136/256 |
| 2012/0204938 | A1 | 8/2012 | Hacke et al. | |
| 2013/0000715 | A1 | 1/2013 | Moslehi et al. | |
| 2013/0139871 | A1* | 6/2013 | Hirata et al. | 136/251 |
| 2015/0000720 | A1* | 1/2015 | DeGroot et al. | 136/244 |

FOREIGN PATENT DOCUMENTS

DE   10 2008 060 211 A1   6/2010

OTHER PUBLICATIONS

PCT International Search Report and Written Opinion of the International Searching Authority for Application No. PCT/US2014/041971, Oct. 8, 2014, 9 sheets.

* cited by examiner

*Primary Examiner* — Jayne Mershon
*Assistant Examiner* — Mayla Gonzalez Ramos
(74) *Attorney, Agent, or Firm* — Okamoto & Benedicto LLP

(57) ABSTRACT

An adhesive may be applied to a surface of a reusable carrier. Metal foil may be attached to the adhesive to couple the metal foil to the surface of the reusable carrier. The metal foil may be patterned without damaging the reusable carrier. A semiconductor structure (e.g., a solar cell) may be attached to the patterned metal foil. The reusable carrier may then be removed. In some embodiments, the semiconductor structure may be encapsulated using an encapsulant, with the adhesive being compatible with the encapsulant.

16 Claims, 3 Drawing Sheets

PATTERNED THIN FOIL

BACKGROUND

Semiconductors are widely used in most of electronic devices today. Some examples of semiconductor structures include diodes, light emitting diodes, and solar cells. Solar cells are well known devices for converting solar radiation to electrical energy. They can be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact regions and contact fingers allow an external electrical circuit to be coupled to and be powered by the solar cell.

In some instances, the electrical circuit for solar modules may be divided between the solar cell components and the solar module components. For example, a portion of the electrical circuit may reside at the solar cell component level. That portion may be referred to as the M1 layer. Another portion of the electrical circuit may reside at the module component level and may be referred to as the M2 layer. However, implementation of an M2 layer can be cost prohibitive.

BRIEF SUMMARY

This disclosure describes techniques and structures for using patterned thin foil as a metal layer in semiconductors. In one embodiment, an adhesive may be applied to a surface of a reusable carrier. Metal foil may be attached to the adhesive to couple the metal foil to the surface of the reusable carrier. The metal foil may be patterned without damaging the reusable carrier. A semiconductor (e.g., a solar cell) may be attached to the patterned metal foil. The reusable carrier may then be removed. In some embodiments, the solar cell may be encapsulated with an encapsulant. The adhesive may be compatible with the encapsulant.

In one embodiment, a metal layer may be coupled to a surface of a carrier via an adhesive layer that is compatible with an encapsulant of a solar module. First and second portions of the metal layer may be patterned and first and second solar cells may be coupled to the first and second patterned portions, respectively. In various embodiments, the carrier may then be removed.

In one embodiment, an encapsulant-compliant adhesive may be applied to a reusable carrier. A metal foil may then be attached to the encapsulant-compliant adhesive. The metal foil may be patterned. A wafer may be attached to the patterned metal foil and the reusable carrier may be removed. In one embodiment, at least some of the encapsulant-compliant adhesive may remain on the patterned metal foil after removing the reusable carrier.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
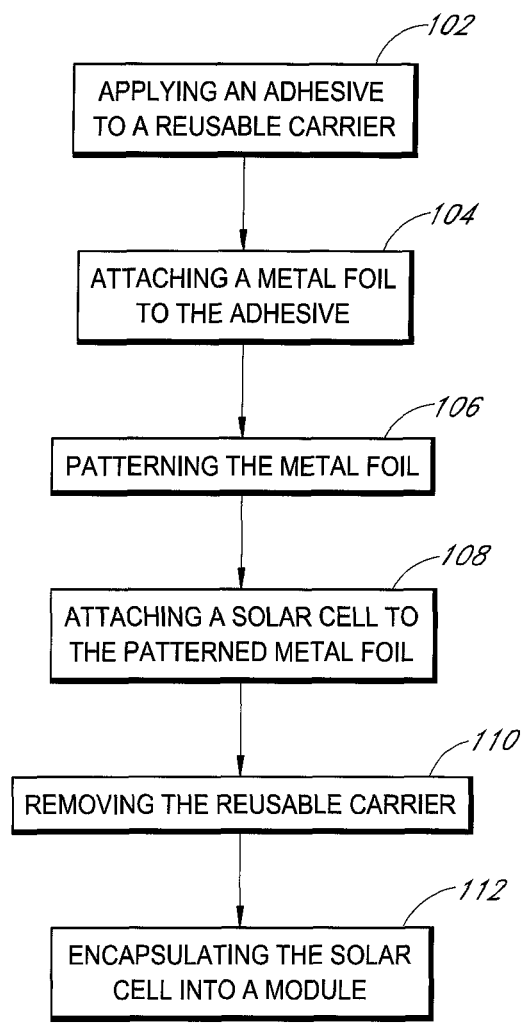
FIG. 1 is a flow chart illustrating a method for using patterned thin foil as a metal layer in semiconductor structures, according to some embodiments.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Based On." As used herein, this term is used to describe one or more factors that affect a determination. This term does not foreclose additional factors that may affect a determination. That is, a determination may be solely based on those factors or based, at least in part, on those factors.

Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of solar cells, strings of solar cells, and solar modules that include solar cells for ease of understanding, the disclosed techniques and structures apply equally to other semiconductor structures (e.g., silicon wafers generally).

Turning now to FIG. 1, a flow chart illustrating a method for using patterned thin foil as a metal layer in solar cells is shown, according to some embodiments. In various embodiments, the method of FIG. 1 may include additional (or fewer) blocks than illustrated. For example, in one embodiment, the metal foil may be pre-patterned, as described below. In such an embodiment, block 106 may not be necessary (or may supplement the pre-patterning).

As shown at 102, an adhesive, which may also be referred to as an adhesive layer, may be applied to a surface of a reusable carrier. In various embodiments, the adhesive may be compatible with an encapsulant (e.g., XUR, EVA, etc.) used to encapsulate solar cells. The term compatible or compliant with the encapsulant is used herein to mean that the adhesive has electrical, mechanical, and/or chemical, etc. properties that are similar to and/or do not adversely affect the properties of the encapsulant. For example, the encapsulant-compliant adhesive and the encapsulant may have similar curing properties. In one embodiment, the adhesive may even have properties that synergistically enhance or improve the properties of the encapsulant.

In one embodiment, the adhesive may be a liquid or solid adhesive that is usable to create a thin uniform layer of the adhesive that adheres to the surface of the reusable carrier. The adhesive layer may be a thin material that is less than the thickness of the encapsulant. Examples of an encapsulant-compliant adhesive include hot melt adhesive (HMA), liquid silicon, etc. In various embodiments, the adhesive may include other properties as well, such as being optically transparent to an attachment laser (e.g., a laser performing attachment of the solar cell to the foil) and/or optically opaque to the patterning laser (e.g., laser performing the patterning of the foil).

At 104, a metal foil may be attached to the adhesive to couple the metal foil to the surface of the reusable carrier. Attaching the metal foil may include rolling a thin metal foil layer onto the adhesive resulting in the metal foil having a smooth, uniform, and planar surface. In some embodiments, the metal foil may be a single continuous piece of metal foil. The attachment of the metal foil to the adhesive may be referred to a loose attachment/adhering such that the metal foil may be removed from the reusable carrier without significant effort (e.g., by peeling and not requiring a large amount of force) yet may be adhered enough to hold the foil in place for patterning the foil and attaching the cell to the foil.

As illustrated at 106, the metal foil may be patterned. The resulting patterned metal foil may be an M2 layer that is usable with an M1 layer of the solar cells. In one embodiment, patterning the metal foil may include ablating the metal foil with a laser in a subtractive patterning process. The patterning laser may be positioned above (offset or directly above) the foil and lase into the foil. Alternatively, the patterning laser may be positioned to the side of the foil and carrier. In one embodiment, the adherent may be opaque to the patterning laser to effectively prevent the patterning laser from damaging the reusable carrier such that the carrier may be reused. In one embodiment, patterning the metal foil may include absorbing metal removed during the patterning process into the adhesive, which may minimize debris collection by removing the absorbed metal when the carrier is removed at block 110, as described below.

In one embodiment, patterning may be custom based on the individual solar cell to account for minor variations from cell to cell. For example, a solar cell may be imaged (e.g., by a high resolution camera or other imaging device) such that its dimensions, finger locations, etc. are precisely and uniquely measured/determined. Patterning of the foil may then be based on the imaged solar cell (e.g., based on the information regarding precise locations/layout of the particular solar cell) such that the patterned foil matches the imaged solar cell to improve alignment from solar cell to patterned foil and minimize distortion.

In one embodiment, custom patterning may be performed for each solar cell. In another embodiment, custom patterning may be performed for a particular solar cell of a batch of solar cells and the metal foil may be patterned for the remainder of the solar cells of the batch according to the custom pattern for that particular solar cell. Other variations for custom patterning may also exist. For instance, the solar cells may be imaged as part of the registering or aligning the solar cells to the patterned foil. If various landmarks of a solar cell fall outside a tolerance limit, custom patterning of the foil may be performed. Otherwise, if the various landmarks fall within the tolerance limit, a generic patterning or previous custom patterning (as based on another particular solar cell) may be performed. Accordingly, custom patterning may be performed periodically (e.g., for a particular ratio of solar cells), for each solar cell, or based on the individual solar cell.

Note that, in some embodiments, the metal foil may be pre-patterned. In such embodiments, block 106 of the method of FIG. 1 may be omitted. Or, in one embodiment, the pre-patterning may not be complete such that additional patterning may be performed at block 106 to complete the patterning of the metal foil. Various examples are discussed below.

As shown at 108, a solar cell (or multiple solar cells) may be attached to the patterned metal foil. For example, the solar cell(s) may be attached to the patterned metal foil through thermal welding, laser welding, soldering, and/or other attachment techniques. In an embodiment in which the foil is a single continuous piece of metal foil, the multiple solar cells may be attached to the single continuous piece of metal foil. As described herein, coupling of the solar cell to the patterned foil may complete the circuit from the M1 layer of the cell to the M2 layer of the patterned foil.

In one embodiment, the laser that is used for attaching the solar cells to the metal foil may lase through the carrier and through the adherent such that the bond from M1 to M2 may be performed. Thus, in one embodiment, the adherent (and the reusable carrier) may be transparent to the attachment laser (note again, that the adherent may be opaque to the patterning laser). The laser used for attachment may be chosen and/or configured (e.g., wavelength, etc.) such that the reusable carrier is not damaged and may be reused.

In various embodiments, the solar cell may be aligned to the stationary (during alignment) patterned metal foil prior to attaching, whereas in other embodiments, the metal foil may be aligned to the stationary (during alignment) solar cell. Aligning the solar cell may include picking up the cell, chucking the cell, using an imaging device (e.g., camera, laser, etc.) to determine various landmarks in the solar cell to be aligned precisely to the metal foil. Collectively, the picking up, chucking, imaging, aligning, and placing the cell may be performed by a precision movement system. Note that in the custom patterning embodiments described above, some portions of the precision movement system may take place prior to patterning. For example, imaging the solar cell may take place before patterning and may not need to be repeated at block 108.

In various embodiments in which multiple solar cells/wafers are attached to the metal foil, the solar cells/wafers may be electrically coupled to one another. As a simple illustrative example using two solar cells, attaching the first and second solar cells to the metal foil may also include electrically coupling the first solar cell to the second solar cell. Accordingly, attaching the solar cells together may result in a string of solar cells. In one embodiment, the patterning of the foil may include additional M2 layer patterning that completes the electrical connection between the first and second solar cells. In another embodiment, the electrical coupling of the first and second solar cells may not take place in the patterning of the foil.

Patterning the foil for multiple solar cells may be performed before attaching those solar cells. Consider a simple example using four solar cells to illustrate such patterning and attaching. The metal foil may be patterned for all four solar cells and then the four solar cells may be attached to the pattern metal foil. In another embodiment, patterning and attaching may alternate such that a first portion of the foil may be patterned for the first solar cell, the first solar cell may be attached to the patterned first portion, a second portion of the foil may be patterned for the second solar cell, the second solar cell may be attached to the patterned second portion, and so on. As noted above, the different portions of patterned metal foil may be patterned differently such that the first portion is patterned differently than the second portion (e.g., for custom patterning).

At 110, after the metal foil has been patterned and after the solar cell(s) have been attached to the patterned foil, the reusable carrier may be removed from the solar cell/patterned foil assembly. In various embodiments, the reusable carrier may be manually removed (e.g., peeled), thermally delaminated, among other techniques.

In one embodiment, removing the reusable carrier may result in at least a portion of the adhesive remaining on the metal foil and another portion remaining on the reusable carrier. As described herein, because the adherent is compliant with the encapsulant used to encapsulate the solar cells, the adherent that remains on the metal foil may not negatively affect operation of the cell or module. The reusable carrier may be cleaned (e.g., chemically, mechanically, etc.) of its remaining adherent and it may then be reused.

Figure 5:
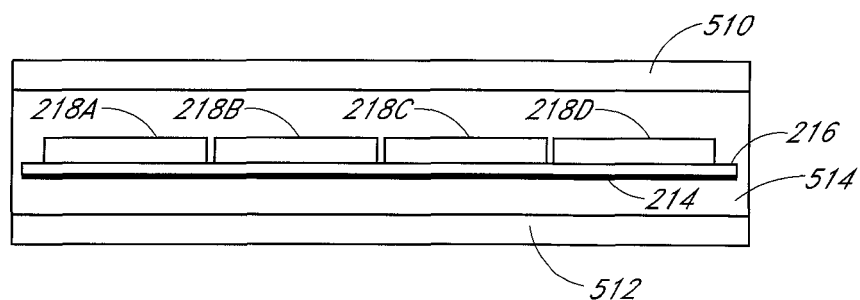
FIG. 5 is a cross-sectional representation of a solar module that includes solar cells attached to patterned thin foil.

As illustrated at 112, the solar cell(s) may be encapsulated with an encapsulant. As described herein, the adhesive may be compatible/compliant with the encapsulant. Because the adhesive is compliant with the encapsulant and because there is not a permanent carrier as part of the final module assembly, the encapsulant may completely or substantially fill the area between the external components of the module (e.g., cover and back layer as shown in FIG. 5) and the solar cell resulting in no or only minor voids in the final module assembly.

In an alternative embodiment, a non-reusable carrier may be used and still result in a module with minor or no voids. For example, a flexible carrier, such as a polyester (PET) carrier, may be used. The patterning laser may perforate the flexible carrier thereby permitting encapsulant to substantially fill the voids in the final module.

Figure 2:
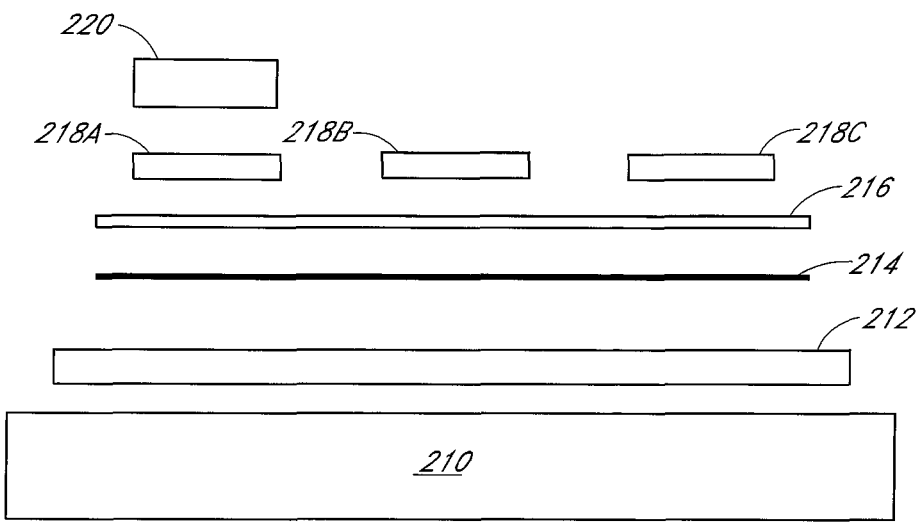
FIG. 2 is a cross-sectional representation of a solar cell attached to patterned metal foil, according to various embodiments.

In yet another embodiment, no carrier may be used at all. Instead, the foil may be rolled out directly on to a stringing chuck (an example stringing chuck is depicted in FIG. 2) or other surface, where the foil may be patterned (if not pre-patterned or, in some cases, even if pre-patterned), and then connected to the solar cell as described herein. In such an embodiment, the stringing chuck may need to be cleaned periodically (e.g., after each string of solar cells is coupled to the foil) to remove any adhesive. Note that if no carrier is used, however, adhesive may not be used in some embodiments. Instead, the foil may be held to the stringing chuck by vacuum or comparable technique.

In another embodiment in which no carrier and no adhesive are used, the solar cell may be placed directly on the stringing chuck or other processing surface followed by the foil being placed on the solar cell. The foil may then be brought into intimate (e.g., substantially complete, substantially uniform) contact with the wafer. Bringing the foil into contact with the wafer may performed by mechanical force that is sufficient to achieve intimate contact between the foil and wafer. Examples of mechanical force may include air (forced air or vacuum), pressing (e.g., the wafer chuck or similar device pressing the foil and wafer against the processing surface), etc. Bringing the foil into contact with the wafer may be performed from above the foil or from below the wafer. While the foil is held in intimate contact with the solar cell, a laser may lase through the wafer chuck, which may be optically transparent to the laser, to couple the foil to the wafer. The foil may then be patterned. In one embodiment, the wafer chuck may be removed before patterning. Note that, as described herein, the foil may also be pre-patterned (e.g., dimpled, embossed, weakened, perforated, etc.).

Note that in embodiments in which a laser lases through a stringing chuck, the stringing chuck may likewise be optically transparent to the laser.

The disclosed techniques may allow for metal foil to be used as an M2 layer without the need for a permanent supporting base material, yet provide for precise alignment of the solar cells to the patterned foil with minimal distortion. Because the adherent is compatible with the encapsulant, the portion of the adherent that remains on the metal foil may not adversely affect operation of the solar cell or module. Moreover, using a reusable carrier may lower cost and because the carrier is not part of the module, the possibility of voids in the final solar module may be eliminated or greatly reduced.

FIG. 2 is a cross-sectional representation of a semiconductor structure attached to patterned metal foil, according to various embodiments. As shown, reusable carrier 212 may be placed on stringing chuck 210. Reusable carrier 212 may be held in place on stringing chuck 210 in a variety of manners, such as vacuum, adhesive, clamped, mechanical force (e.g., from wafer chuck 220), etc. Adhesive 214 may be applied to reusable carrier 212 to attach metal foil 216 to reusable carrier. As described herein, metal foil 216 may be pre-patterned, or may be patterned after being attached to the reusable carrier according to the techniques described herein. As shown, wafer chuck 220, as part of a precision movement system may position solar cells 218A, 218B, and 218C for attachment to metal foil 216. Not shown in FIG. 2, a laser or other device may be used to pattern metal foil 216 prior to attaching the solar cells. Also not shown in FIG. 2, a laser, welder, or other device may be used to attach the solar cells to metal foil 216.

Figure 3:
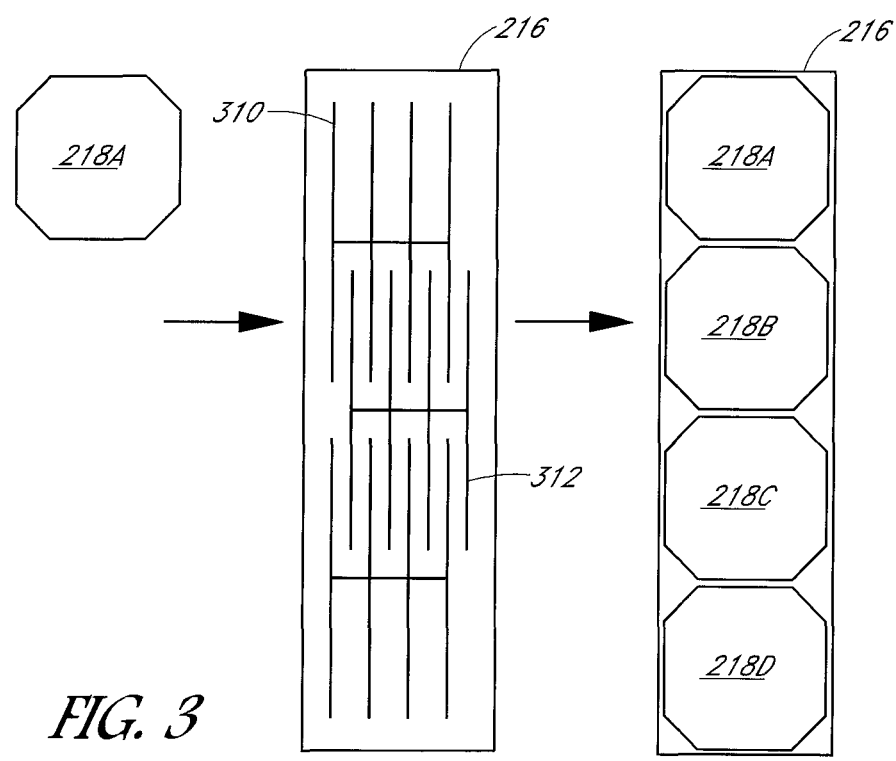
FIG. 3 is a top view representation of attaching a solar cell to patterned metal foil, according to various embodiments.

FIG. 3 is a top view representation of attaching a semiconductor wafer to patterned metal foil, according to various embodiments. As shown from left to right, solar cell 218A (left most portion of FIG. 3) is attached to patterned metal foil 216 (middle portion of FIG. 3) resulting in the string of solar cells attached to the metal foil and one another, as shown in the right most portion of FIG. 3. In the example of FIG. 3, patterned metal foil 216 illustrates patterned P regions 310 and patterned N regions 312 in a pattern that permits wafers to be flipped for faster patterning. In another embodiment, a more traditional P/N offset patterning may be used.

As shown in the right most image of FIG. 3, metal foil 216 may include diamond regions in which the solar cells to do not completely cover the metal foil. In various embodiments, those diamond regions of foil may be removed (e.g., by laser ablation) after attaching the solar cells, or the foil may be partially pre-patterned and not include those diamond portions of foil.

Figure 4:
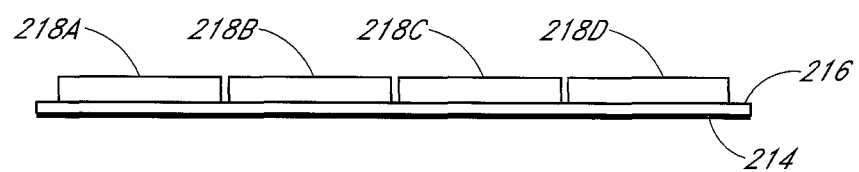
FIG. 4 is a cross-sectional representation of a solar cell attached to patterned metal foil, according to various embodiments.

FIG. 4 is a cross-sectional representation of a semiconductor attached to patterned metal foil, according to various embodiments. As shown, the representation of stringed solar cells in FIG. 4 is similar to that of FIG. 2 except that the reusable carrier has been removed in FIG. 4. As shown, four solar cells, solar cells 218A, 218B, 218C, and 218D are attached to metal foil 216 and to each other. Also as shown, at least a portion of adhesive 214 remains on the bottom of metal foil 216 after the reusable carrier has been removed.

FIG. 5 is a cross-sectional representation of a solar module that includes the stringed solar cells of FIG. 4. As shown in FIG. 5, the stringed solar cells have been encapsulated with encapsulant 514. As described herein, adhesive 214 is compatible with encapsulant 514. Also in FIG. 5, a back layer 512 is shown. In one embodiment, back layer 512 may be a backsheet. The backsheet may be any suitable type of backsheet that is capable of providing environmental protection, mechanical stiffness, and/or electrical insulation, etc.

Also shown in FIG. 5, cover layer 510 (e.g., glass) has been added to the encapsulated solar cells to create a solar module. In various embodiments, cover layer 510 may constructed of a clear, or translucent, material, such as glass or a plastic. Various colors of glass or plastic may be used for cover layer 510. In one embodiment, different colors (e.g., white, black, etc.) may be used in cover layer 510 (e.g., one color for the area corresponding to solar cell locations and another color for the area corresponding to the regions between solar cells). In various embodiments, cover layer 510 may be treated and/or formulated with an anti-reflective material or coating to inhibit loss of photons at the surface or, or through, cover layer 510.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
    applying an adhesive to a surface of a reusable carrier;
    attaching a metal foil to the adhesive to couple the metal foil to the surface of the reusable carrier;
    patterning the metal foil without damaging the reusable carrier;
    attaching a first solar cell to the patterned metal foil;
    removing the reusable carrier from the metal foil; and
    encapsulating the first solar cell using an encapsulant,
    wherein said applying includes using an adhesive that is compatible with the encapsulant, wherein said patterning the metal foil includes absorbing metal removed during said patterning into the adhesive, and wherein said removing the reusable carrier includes removing the absorbed metal.

2. The method of claim 1, wherein said removing the reusable carrier results in at least a portion of the adhesive remaining on the metal foil.

3. The method of claim 1, further comprising:
    attaching a second solar cell to the patterned metal foil, wherein the patterned metal foil is a single continuous piece of metal foil.

4. The method of claim 3, wherein said attaching the first solar cell and said attaching the second solar cell includes electrically coupling the first solar cell to the second solar cell.

5. The method of claim 1, wherein said attaching the first solar cell includes aligning the first solar cell to the patterned metal foil.

6. The method of claim 1, wherein said attaching the first solar cell includes using a laser to attach the first solar cell to the patterned metal foil.

7. The method of claim 1, wherein said patterning the metal foil includes ablating the metal foil with a laser in a subtractive patterning process.

8. The method of claim 1, further comprising:
    imaging the first solar cell, wherein said patterning is based, at least in part, on the imaged first solar cell.

9. The method of claim 1, wherein said attaching the metal foil includes rolling the metal foil onto the adhesive resulting in the metal foil having a uniform and planar surface.

10. A string of solar cells according to the method of claim 1.

11. A method, comprising:
coupling a metal layer to a surface of a carrier via an adhesive layer that is compatible with an encapsulant of a solar module;
patterning first and second portions of the metal layer;
coupling first and second solar cells to the first and second patterned portions, respectively; and
removing the carrier from the metal layer,
wherein said patterning the first and second portions of the metal layer includes patterning the first portion differently than the second portion.

12. The method of claim 11, further comprising:
encapsulating the first and second solar cells with the encapsulant.

13. The method of claim 11, wherein said coupling the first and second solar cells to the first and second pattern portions includes coupling the first and second solar cells to one another.

14. The method of claim 11, wherein said coupling the first and second solar cells including welding the first and second solar cells to the first and second patterned portions.

15. The method of claim 11, further comprising, prior to performing said removing:
patterning additional portions of the metal layer; and
coupling respective ones of remaining solar cells of the solar module to respective ones of the additional patterned portions, respectively.

16. The method of claim 15, wherein said patterning the additional portions is performed prior to said coupling the first and second solar cells to the first and second patterned portions, respectively.

* * * * *